United States Patent [19]
Sun et al.

[11] Patent Number: 5,834,346
[45] Date of Patent: Nov. 10, 1998

[54] PROCEDURE FOR ELIMINATING BUBBLES FORMED DURING REFLOW OF A DIELECTRIC LAYER OVER AN LDD STRUCTURE

[75] Inventors: Yi-Lin Sun, Taipei; Cheng-Yeh Shih; Chwen-Ming Liu, both of Hsin-Chu, all of Taiwan

[73] Assignee: Taiwan Semiconductor Manufacturing Company, Ltd., Hsin-Chu, Taiwan

[21] Appl. No.: 949,351

[22] Filed: Oct. 14, 1997

[51] Int. Cl.$^6$ .................... H01L 21/8238; H01L 21/336; H01L 21/302

[52] U.S. Cl. .................. 438/231; 438/305; 438/704; 438/760

[58] Field of Search .................. 438/723, 756, 438/760, 305, 704, 230, 231

[56] References Cited

U.S. PATENT DOCUMENTS

| | | | |
|---|---|---|---|
| 4,352,724 | 10/1982 | Sugishima et al. | 204/192 |
| 5,116,460 | 5/1992 | Bukhman | 156/643 |
| 5,328,860 | 7/1994 | Lee et al. | |
| 5,434,096 | 7/1995 | Chu et al. | |

OTHER PUBLICATIONS

Wolf, S. and Tauber, R.N., Silicon Processing for the VLSI Era, vol. 1, Lattice Press, Sunset Beach, California, pp. 531–534.

Primary Examiner—Jey Tsai
Assistant Examiner—Josetta I. Jones
Attorney, Agent, or Firm—George O. Saile; Stephen B. Ackerman

[57] ABSTRACT

A method for preventing bubble formation over source/drain active areas in p-channel MOSFETs is described. Bubble formation occurs when the source/drain areas and silicon containing gate electrodes are implanted with $BF_2^+$ molecule ions following an anisotropic LDD spacer etch using a plasma. It is found that the plasma causes the silicon surface to become prone to adsorption of $BF_2^+$ molecule ions during the source/drain/gate implantation. These adsorbed species are released and form bubbles during reflow of a subsequently deposited glass layer. The invention performs the spacer etch only partially with the anisotropic plasma and completes the spacer formation with a wet etch. The active silicon and gate electrode surfaces are thus not damaged by the plasma. Consequently adsorption of $BF_2^+$ molecule ions is inhibited and bubble formation does not occur during reflow.

17 Claims, 6 Drawing Sheets

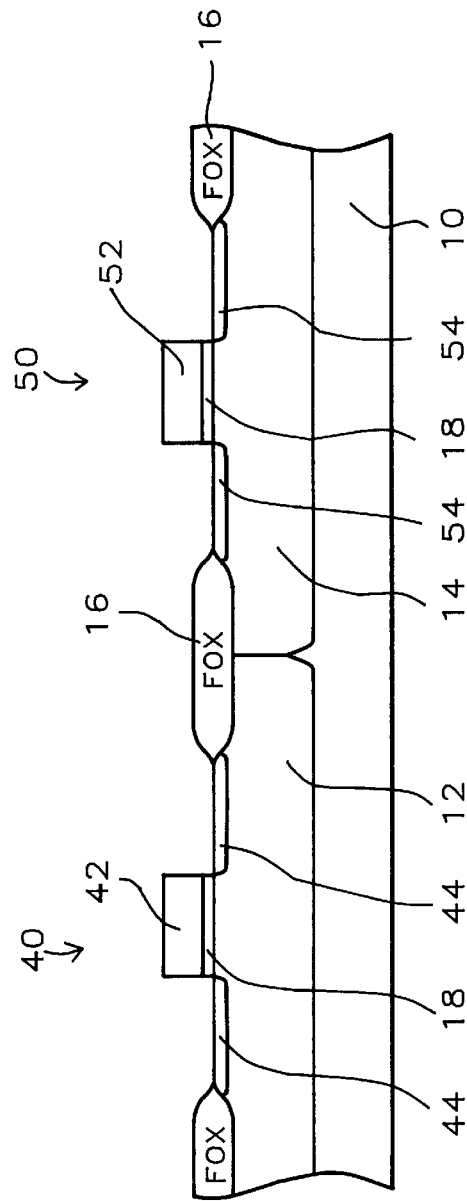
FIG. 1 – Prior Art
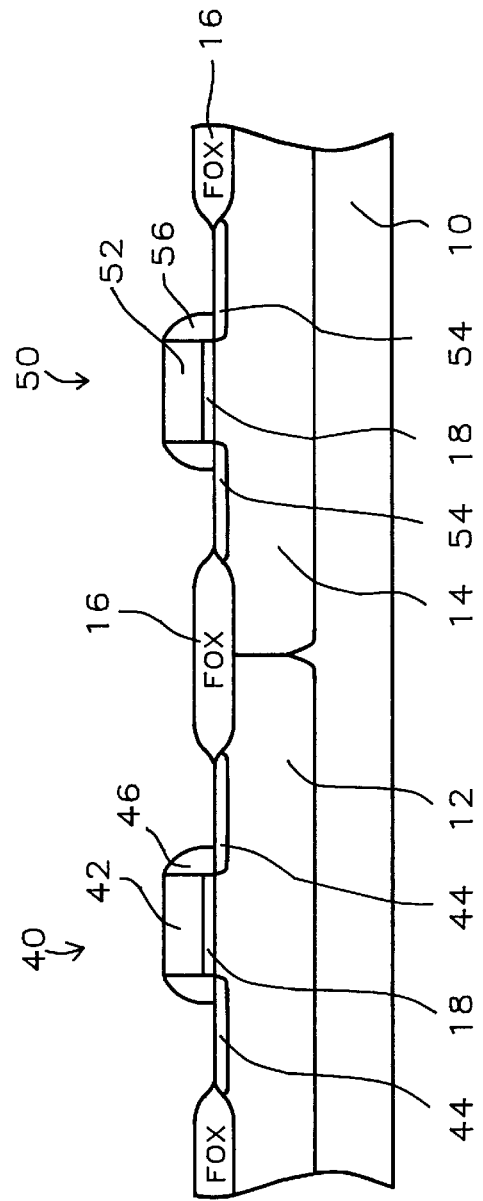
FIG. 2 – Prior Art

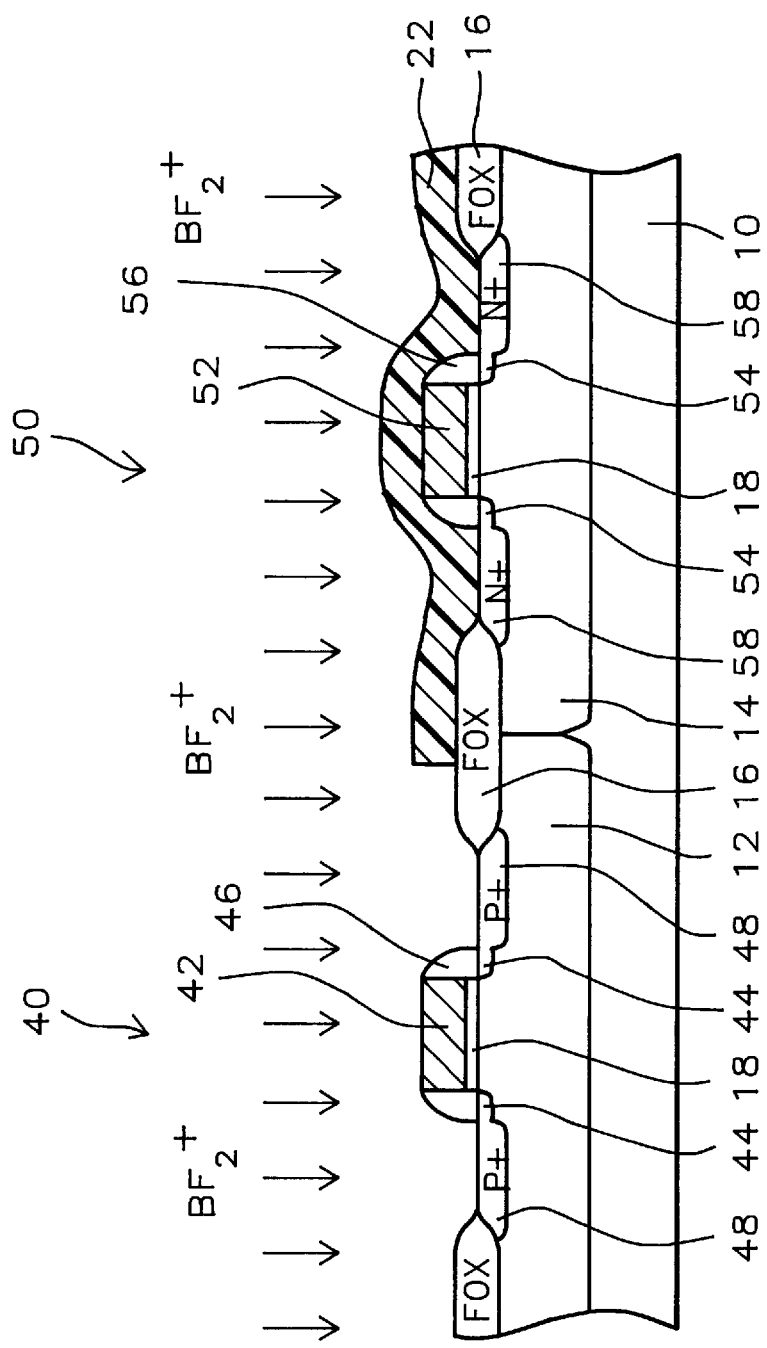
FIG. 3 – Prior Art

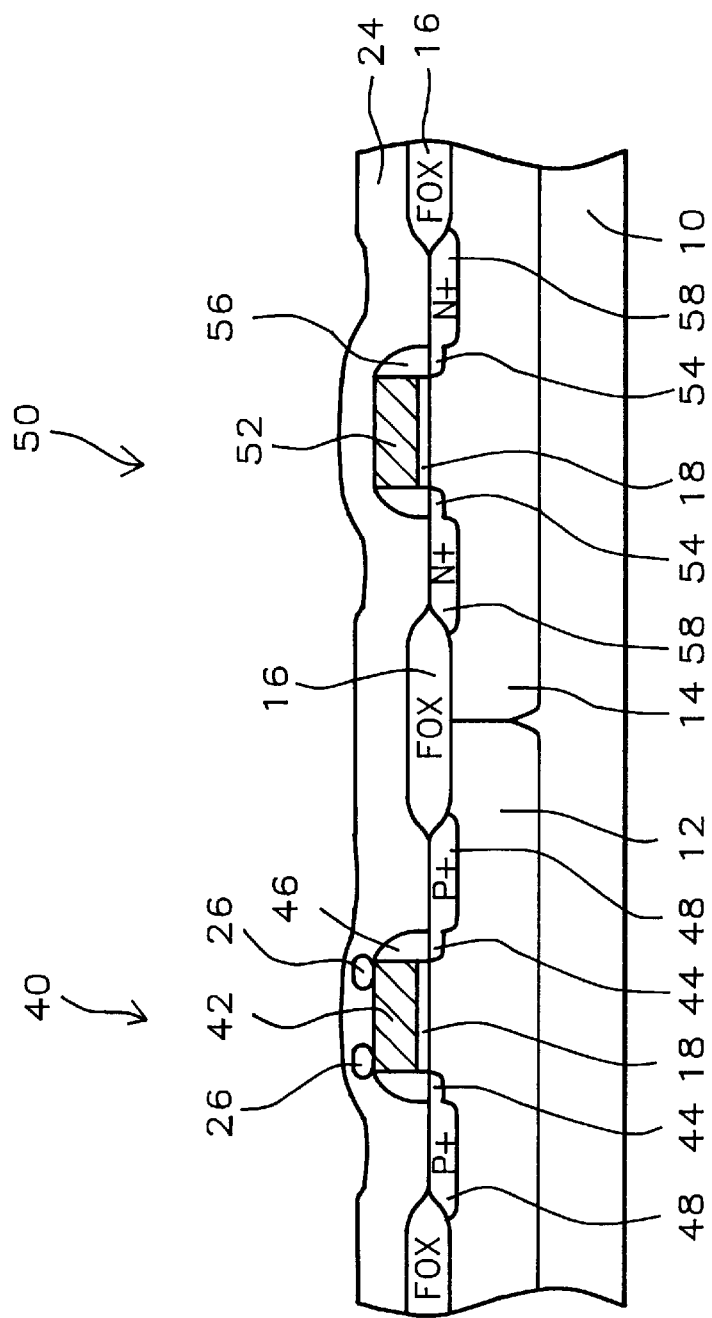
FIG. 4 – Prior Art

PROCEDURE FOR ELIMINATING BUBBLES FORMED DURING REFLOW OF A DIELECTRIC LAYER OVER AN LDD STRUCTURE

BACKGROUND OF THE INVENTION

(1) Field of the Invention

The invention relates to processes for the manufacture of semiconductor devices and more particularly to processes for forming selfaligned-polysilicon-gate field effect transistors.

(2) Background of the Invention and Description of Prior Art

Complimentary metal oxide semiconductor(CMOS) field effect transistor(FET) technology involves the formation and utilization of n-channel MOSFETs(NMOS) and p-channel MOSFETs(PMOS) in combination to form low current, high performance integrated circuits. The complimentary use of NMOS and PMOS devices, typically in the form of a basic inverter device, allows a considerable increase of circuit density of circuit elements by reduction of heat generation. The increase in device density accompanied by the shrinkage of device size has resulted in improved circuit performance and reliability as well as reduced cost. For these reasons CMOS integrated circuits have found widespread use.

In the manufacture of dynamic random access memory (DRAM) integrated circuits (IC), CMOS circuitry is generally confined to the peripheral support circuitry. The cell array, which consumes the larger portion of the DRAM chip, is typically formed entirely of NMOS transistors. The p-channel devices are thus found within the peripheral circuitry.

One well known form of the CMOS configuration is the twin-well structure is shown in cross section, at an early stage of manufacture, by FIG. 1. By processes of photolithography and ion implantation, adjacent islands of p-type silicon 12 and n-type silicon 14 are formed in the surface of silicon wafer 10. Field oxide isolation(FOX) regions 16 are then formed by a well known process of local oxidation of silicon(LOCOS).

A gate oxide 18 is then grown in the exposed silicon regions and a layer of doped polysilicon is deposited over it, typically by low pressure chemical vapor deposition (LPCVD). The polysilicon layer, is patterned by photolithography and etched by an anisotropic etching technique, usually reactive ion etching(RIE) to form the gate electrode 42 of the PMOS device 40 and 52 of the NMOS device 50.

An ion implant is next performed to form the lightly doped drain(LDD) regions 44 and 54. The gate electrodes 42,52 serve as a mask, shielding the gate regions 18 from the implant, thereby making the source and drain regions self-aligned to the gate. Using a block out mask, the PMOS device 40 is covered while the source and drain regions 54 of the NMOS device 50 are implanted with an n-type dopant such as arsenic. Similarly the NMOS device 50 is masked while the source and drain regions 44 of the PMOS device 40 are implanted with a p-type dopant such as boron or the boron difluoride ion ($BF_2^+$). In the present day sub-micron device technology, arsenic and $BF_2^+$ are the preferred dopant species for the NMOS and PMOS devices respectively.

Referring next to FIG. 2, a conformal layer of silicon oxide is deposited over the wafer and anisotropically etched back to the silicon by RIE, the sidewall spacers 46 and 56 are thus formed alongside the gate electrodes 42 and 52.

Referring now to FIG. 3, a photoresist block-out mask 22 protects the n-channel device 50 while the source and drain regions 48 of the p-channel device 40 are implanted with $BF_2^+$ The source and drain regions 58 of the n-channel device 50 are similarly formed by implanting arsenic while the p-channel device is masked.

Referring next to FIG. 4, a inter poly oxide (IPO) 24 layer is deposited by LPCVD at a temperature of about 700° C. The layer 24 is typically of a flowable silicate glass such BPTEOS, a glass formed by the decomposition of tetraethylorthosilicate(TEOS) in the presence of boron and phosphorous containing compounds such as trimethyl borate and trimethly phosphate. The flowable BPTEOS layer 24 typically is formed over a thinner layer of silicon oxide. The layer 24 is then planarized by flowing the glass at a temperature of about 850° C.

It is found that, in a conventional process, bubbles 26 are formed over the polysilicon gate edges of the p-channel devices during the flow of the IPO layer 24. These bubbles 26 do not occur elsewhere. Bubbles also form over polysilicon gate electrodes which have tungsten silicide deposited over them. It has also been found by experiment that the severity of the bubble formation is directly related to the degree of exposure of the active silicon region 48 to the RIE plasma during the sidewall spacer etch back step.

Bubble formation is also found to occur in regions where polysilicon lines, which have been implanted with $BF_2^+$ ions, travel over field oxide regions as illustrated in the plan view of a portion of an integrated circuit shown in FIG. 5. The plan view shown in FIG. 5 was drawn from an optical photomicrograph wherein the bubbles are clearly visible. The polysilicon lines 41 pass over bands of field oxide 16 and gate oxide 18. The bubbles 26 appear at the transition between the field oxide 16 and the gate oxide 18. The cross section represented by 6—6' is shown in FIG. 6 where the position of the bubbles 26 may be seen at these transitions.

Mapping of the bubble formation over the wafer shows that bubble formation is more pronounced in the global regions where the etch rate is greater. This varies from tool to tool.

It is believed that the formation of bubbles is caused by the adsorption of $BF_2^+$ ions onto silicon surfaces which have been exposed to the RIE plasma during the spacer etch. Plasma exposure produces Si dangling bonds on these surfaces which are adsorption sites for the $BF_2^+$ ions. During IPO flow the ions escape these sites to form bubbles. The surfaces exposed to the RIE plasma and subsequently to the $BF_2^+$ ions are the active areas and polysilicon gate electrodes of the p-channel devices.

The formation of bubbles during the IPO flow can sometimes be avoided if the polysilicon has tungsten silicide over it and the wafer is subjected to an 800° C. bake prior to the IPO deposition. This treatment does not work for polysilicon alone. However, an additional thermal procedure is not welcome to the already taxed thermal budget of shallow sub-micron device technology. This is especially true for the manufacture of DRAMs. The substitution of boron at low energies in place of $BF_2^+$ is also not a viable alternative since the required low energies of 6 to 7 keV are not generally attainable in stable form in currently available implanting tools.

The solution offered by this invention inhibits the adsorption of $BF_2^+$ ions onto exposed silicon surfaces during ion implantation by preventing exposure of silicon surfaces to the RIE plasma during the spacer etch. This is accomplished by first etching the spacer oxide anisotropically by RIE to near completion and then removing remaining spacer oxide over the active region with a wet etch.

Sugishima et.al. U.S. Pat. No. 4,352,724 cite the use of isotropic and anisotropic etching as a means for attaining fine pattern definition while at the same time avoiding sharp steps. The procedure uses an isotropic etch, either wet or plasma, as the first step. The anisotropic RIE etch is the second and final step which would not have the desired effect of reducing the incidence of IPO bubbles.

Bukhman U.S. Pat. No. 5,116,460 performs a partial anisotropic etch of a vertical walled feature using RIE and then, without removing the RIE mask, deposits polymer. The polymer is then etched anisotropically, leaving a vertical sidewall on the feature. The remaining exposed material of the feature is then etched isotropically by a wet etch whereby the polymer prevents lateral etching of the feature. The polymer is then stripped. By etching only partially with RIE, plasma damage to the surface below the feature is avoided.

SUMMARY OF THE INVENTION

It is an object of this invention to provide a method for eliminating bubble formation in an IPO layer over silicon regions which have been subjected to $BF_2^+$ ion implantation without requiring additional thermal processing.

It is another object of this invention to provide a method for reducing the adsorption of $BF_2^+$ or related gaseous species on an exposed silicon surface.

It is yet another object of this invention to provide a method for improving the reliability of p-channel MOSFETs formed by the implantation of $BF_2^+$.

These and other objects are accomplished by performing the spacer etch back by first etching the spacer oxide anisotropically using RIE to a point where approximately 250 Angstroms of the initial spacer oxide thickness remains over the active areas. At this point the subjacent active silicon has not been subjected to exposure by the etching plasma. The RIE is stopped and the wafer withdrawn from the etcher. The remaining oxide is then removed with an aqueous wet etch such as dilute HF or buffered HF. The thickness of the remaining oxide can be well controlled by calibration of the etching tool and using a timed etch period.

The action of the wet etchant, whose etch rate can be well controlled, is quenched when the silicon surface is exposed with little loss of sidewall spacer. Any such loss can be compensated for by adjusting the initial thickness of the spacer material.

BRIEF DESCRIPTION OF THE DRAWINGS

FIG. 1 through FIG. 3 are cross sections of in process CMOS transistors showing a prior art procedure for forming n- and p-channel self-aligned MOSFETs with an LDD structure.

FIG. 4 is a cross section of in-process CMOS transistors showing the occurrence of bubbles within the IPO layer over the p-channel device after reflow of the IPO layer.

DESCRIPTION OF THE PREFERRED EMBODIMENT

Figure 5:
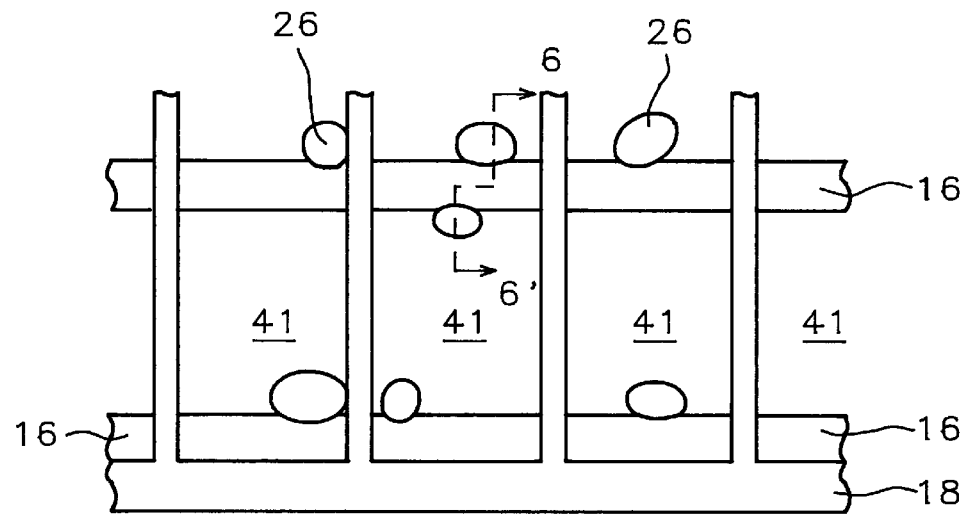
FIG. 5 is a plan view of devices in the peripheral region of a DRAM integrated circuit showing the presence of bubbles in the IPO layer.
Figure 6:
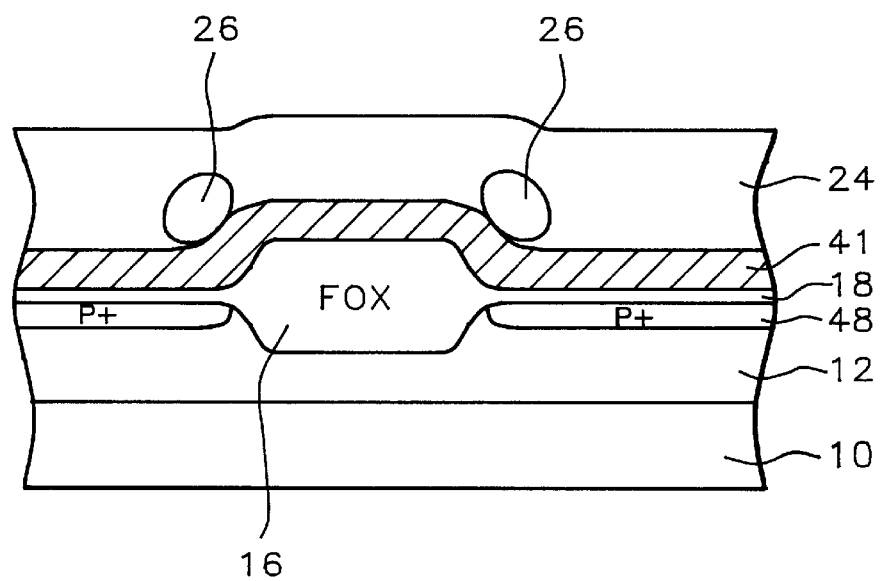
FIG. 6 is a cross section of the wafer shown in FIG. 5 and indicated by the line 6—6' thereon.
Figure 7:
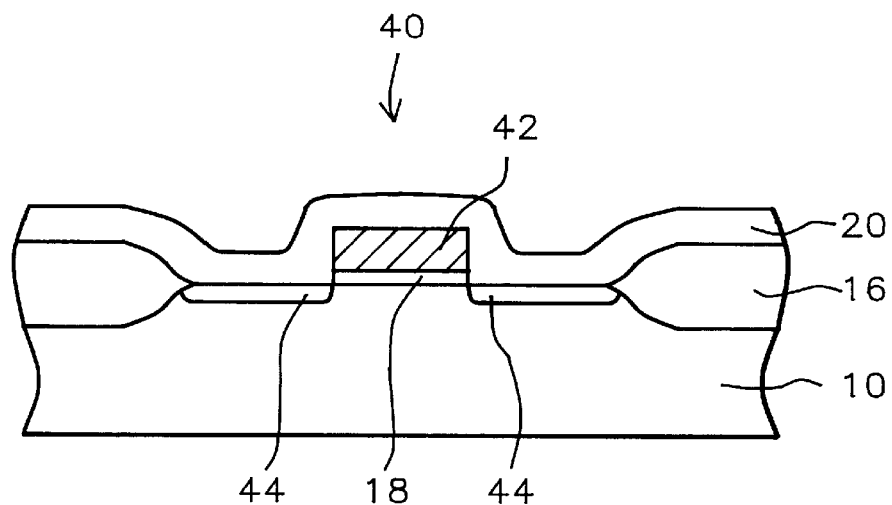
FIG. 7 through FIG. 10 are cross sections of an in-process p-channel MOSFET with LDD illustrating the method of the current invention.

In a preferred embodiment of this invention monocrystalline silicon wafer having an n-type region is provided. Referring to FIG. 7, the wafer 10 is processed using well know CMOS technology to a point in the processing where the active region of a p-channel MOSFET 40 has defined within its surface and isolated by a field oxide 16. The polysilicon gate electrode 42 has been formed over the gate oxide 18 and a self-aligned $BF_2^+$ implant has provided to form the p-type regions 44. Whereas the current embodiment uses a polysilicon gate electrode, a composite gate electrode comprising polysilicon with a superjacent layer of tungsten silicide or other silicide may also be used.

A layer of silicon oxide 20 is deposited over the wafer 10 to a thickness of between about 1,500 and 2,000 Angstroms using well known CVD techniques. The thickness of the layer 20 is determined according to the target width of the sidewall spacers which will be formed from it. Whereas the current embodiment uses silicon oxide spacers, other spacer materials such as silicon nitride, silicon oxynitride or another insulative material could be used as well.

Figure 8:
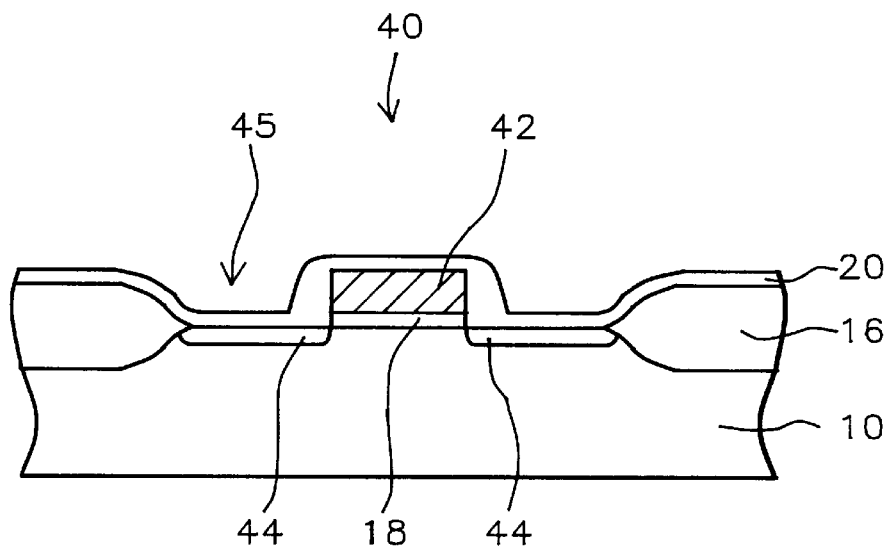
Figure 9:
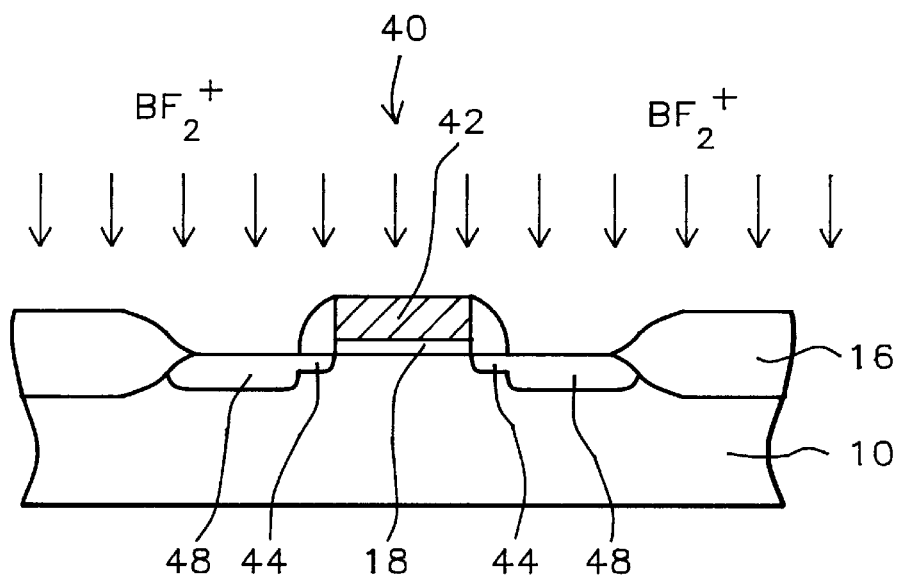

Referring next to FIG. 8 the wafer is placed into an RIE tool and the layer 20 is anisotropically etched using well known procedures and etchants, for example $CHF_3+CF_4$ in a He carrier gas. The etching proceeds until between about 100 and 300 Angstroms of the layer 20 remain over the source/drain regions 45. This assures that the surface of the crystalline silicon below the layer 20 is not damaged by the plasma.

An aqueous etchant whose etch rate is stable and can be accurately determined is then used to remove the remaining silicon oxide over the planar regions. HF either diluted with water by 100:1 or buffered with $NH_4F$ are appropriate wet etchants for the silicon oxide removal. Alternate wet chemical etchants can be calibrated and used for other spacer materials.

Figure 10:
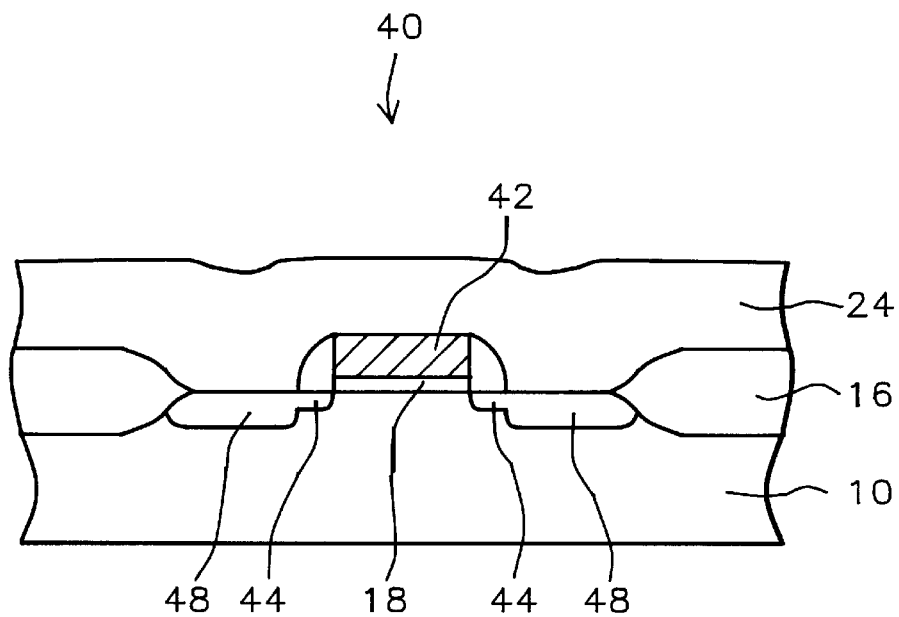

Referring now to FIG. 10, with the silicon surfaces now exposed, the source/drain implant 48 of the p-channel device 40 is performed using $BF_2^+$ at a dose of $5\times10^{15}$ atoms $cm^{-2}$ or thereabout and an energy of 20 keV or thereabout. The undamaged silicon surface does not provide adsorption sites such as silicon dangling bonds, to attract $BF_2^+$ molecule ions or other gaseous species. Next, as depicted by FIG. 11, an IPO layer 24 is deposited over the wafer. The preferred IPO layer 24 in for this embodiment comprises a lower portion of silicon oxide formed by well known CVD methods using undoped TEOS as a precursor, and an upper portion of a flowable glass, for example BPTEOS. The IPO layer 24 is then flowed at a temperature of 800° C. or thereabout to improve the surface planarization. The resultant source/drain regions of the p-channel devices and regions over polysilicon remain free of bubbles after the reflow.

While this invention has been particularly shown and described with reference to the preferred embodiments thereof, it will be understood by those skilled in the art that various changes in form and details may be made without departing from the spirit and scope of the invention.

What is claimed is:

1. A method of forming a p-channel self-aligned gate MOSFET comprising:
   (a) providing a silicon wafer having
      (i) an n-type region surrounded by field isolation;
      (ii) a gate oxide over said n-type region; and
      (iii) a gate electrode over said gate oxide;
   (b) implanting of a p-type impurity into said silicon wafer, thereby forming p-type regions;
   (c) depositing a layer of spacer material;
   (d) partially etching said layer of spacer material with an anisotropic plasma etch;

(e) etching said layer of spacer material with a wet etch, subsequent to step (e), thereby exposing silicon regions while leaving spacers alongside said gate electrode;

(f) implanting said silicon wafer with $BF_2^+$ ions;

(g) depositing a silicon oxide layer;

(h) depositing a layer of flowable glass;

(i) flowing said flowable glass by heating wherein no bubble or delamination is formed in said silicon oxide layer; and (j) forming contacts to said p-channel self aligned gate MOSFET.

2. The method of claim 1 wherein said gate electrode is selected from the group consisting of polysilicon and polysilicon with superjacent tungsten silicide.

3. The method of claim 1 wherein said anisotropic plasma etch is reactive ion etching.

4. The method of claim 1 wherein said layer of spacer material is etched by said anisotropic plasma etch until between about 100 and 300 Angstroms of said layer of spacer material remain over the horizontally planar portions of said p-type regions.

5. The method of claim 1 wherein said spacer material is silicon oxide.

6. The method of claim 5 wherein said wet etch contains HF.

7. The method of claim 1 wherein said spacer material is taken from the group consisting of silicon nitride and silicon oxynitride.

8. The method of claim 7 wherein said wet etch contains phosphoric acid.

9. The method of claim 1 wherein said flowable glass is a borophosphosilicate glass.

10. The method of claim 1 wherein said flowable glass is flowed at a temperature of between about 800° C. and 850° C.

11. A method of forming spacers alongside a vertical feature over a silicon surface without delamination or bubble formation in an overlying dielectric layer in the manufacture of an integrated circuit comprising:

(a) providing a silicon wafer having a vertical feature;

(b) depositing a layer of spacer material over said silicon wafer;

(c) partially etching said layer of spacer material with an anisotropic plasma etch;

(d) etching said layer of spacer material with a wet etch, subsequent to step (c), thereby leaving spacers;

(e) implanting $BF_2^+$ ions into said silicon wafer: and (f) depositing and flowing a dielectric layer over said silicon wafer wherein no bubble or delamination is formed in said dielectric layer.

12. The method of claim 11 wherein said anisotropic plasma etch is reactive ion etching.

13. The method of claim 11 wherein said layer of spacer material is etched by said anisotropic plasma etch until between about 100 and 300 Angstroms of said layer of spacer material remain over the horizontally planar portions of said spacer material.

14. The method of claim 11 wherein said spacer material is silicon oxide.

15. The method of claim 14 wherein said wet etch contains HF.

16. The method of claim 11 wherein said spacer material is taken from the group consisting of silicon nitride and silicon oxynitride.

17. The method of claim 16 wherein said wet etch contains phosphoric acid.

* * * * *